(12) United States Patent
Barringer et al.

(10) Patent No.: US 6,181,148 B1
(45) Date of Patent: Jan. 30, 2001

(54) AUTOMATED TEST HEAD INTERFACE BOARD LOCKING AND DOCKING MECHANISM

(75) Inventors: Dennis R. Barringer, Wallkill; Drew R. Horvath, Red Hook, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/119,426

(22) Filed: Jul. 20, 1998

(51) Int. Cl.$^7$ .................................................. G01R 31/02
(52) U.S. Cl. ........................................ 324/758; 324/755
(58) Field of Search .................... 324/758, 755, 324/754, 765, 158.1, 73.1; 438/16, 17–18, 14; 257/40, 48; 439/482, 824

(56) References Cited

U.S. PATENT DOCUMENTS

| | | | |
|---|---|---|---|
| 4,160,207 | 7/1979 | Haines | 324/158 |
| 4,251,772 | 2/1981 | Worsham et al. | 324/158 |
| 4,322,682 | 3/1982 | Schadwill | 324/158 |
| 4,660,123 | 4/1987 | Hermann | 361/386 |
| 4,797,610 | 1/1989 | Fombellida | 324/158 F |
| 4,812,754 | 3/1989 | Tracy et al. | 324/158 F |
| 5,157,325 | 10/1992 | Murphy | 324/158 F |
| 5,254,939 | 10/1993 | Anderson et al. | 324/158 P |
| 5,295,853 | 3/1994 | Nagakusa et al. | 439/330 |
| 5,416,592 | 5/1995 | Mori et al. | 356/399 |
| 5,444,386 | 8/1995 | Mizumura | 324/754 |
| 5,471,148 | 11/1995 | Sinsheimer et al. | 324/754 |
| 5,517,126 | 5/1996 | Yamaguchi | 324/758 |
| 5,521,522 | 5/1996 | Abe et al. | 324/758 |
| 5,528,158 | 6/1996 | Sinsheimer et al. | 324/758 |
| 5,568,056 | 10/1996 | Ishimoto | 324/754 |
| 5,570,032 | 10/1996 | Atkins et al. | 324/760 |
| 5,594,357 | 1/1997 | Nakajima | 324/758 |
| 5,600,257 | 2/1997 | Leas et al. | 324/754 |
| 5,604,444 | 2/1997 | Harwood et al. | 324/754 |
| 5,644,246 | 7/1997 | Lee et al. | 324/754 |
| 5,656,942 | * 8/1997 | Watts et al. | 324/754 |
| 5,656,943 | 8/1997 | Montoya et al. | 324/754 |
| 5,729,149 | 3/1998 | Bradshaw et al. | 324/758 |
| 5,747,994 | 5/1998 | Suga | 324/158.1 |
| 5,754,057 | 5/1998 | Hama et al. | 324/754 |
| 5,923,180 | * 7/1999 | Botka et al. | 324/758 |

* cited by examiner

*Primary Examiner*—Vinh P. Nguyen
(74) *Attorney, Agent, or Firm*—Steven Capella

(57) ABSTRACT

An improved design for establishing contact between the device under test (DUT) and electrical contacts contained in the test head structure enables the provision of more contact points and/or the accommodation of a larger DUT. The test head includes an in-board mechanism to couple and decouple the movement of an engaging/releasing member with a holder (stiffener/clamp) for a DUT whereby the DUT is brought into and out of contact with electrical contacts in the test head. The mechanism preferably includes gripper pins in the holder (stiffener/clamp) which are coupled or decoupled from a pull arm using a combination of spring clips and spreader pins.

18 Claims, 4 Drawing Sheets

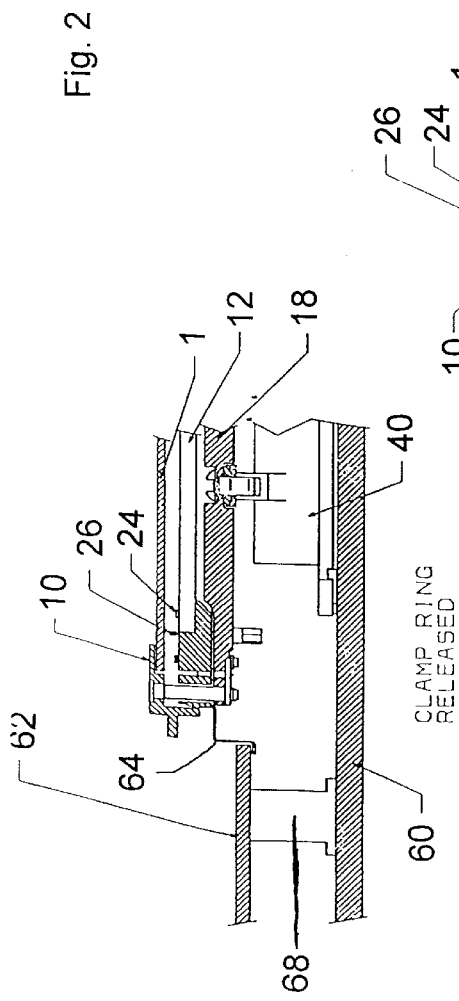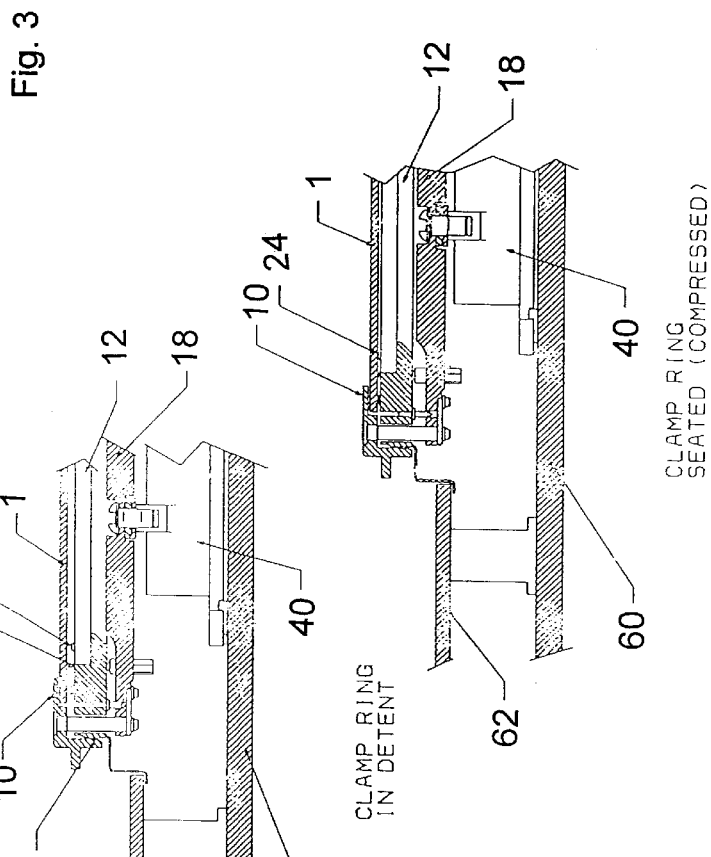

AUTOMATED TEST HEAD INTERFACE BOARD LOCKING AND DOCKING MECHANISM

BACKGROUND OF THE INVENTION

Printed circuit boards, integrated circuit wafers and electronic packages and other electronic components are widely used in almost every aspect of the electronics industry. It is important to be able to test the electrical integrity and performance characteristics of these components during manufacture and/or in the field. The ability to perform testing in a facile manner leads to decreased product development time, improved product quality control, and improved technical (diagnostic) service in the field.

The ability to adequately test various boards, wafers and packages in a fast, economical and reliable manner becomes more challenging with the ever increasing density of devices contained on these electronic components. Additional challenges may also be presented where the size (e.g., device-occupied surface area) of these electrical components is also increasing. In meeting these testing challenges, it is naturally desirable to minimize the capital outlay for new test equipment. It is highly desirable to adapt current testing equipment to the testing of more complex electronic components. The ability to adapt testing equipment can result in the ability to avoid or postpone capital investment in testing equipment while still meeting the testing objectives.

Most electronic testing equipment contains two primary functions, namely (1) an electronics section for performing testing protocols and/or reporting test results and (2) an interface between the testing equipment electronics and the electronic component or device under test (DUT). The electronics section of the test equipment used to perform the DUT testing is often fairly adaptable to the increased electrical testing complexity.

While the testing power of electronics section may be adequate or easily adaptable, the ability to efficiently interface the testing electronics with the actual DUT to be tested may present a challenge. The interface in most testing equipment involves the use of a test head. The test head typically engages the DUT. Contacts (pins) in the test head are brought into electrical contact with locations on the DUT. Thus, the test head typically contains a plurality of contacts as well as means for engaging the DUT and establishing physical contact (of sufficient electrical conductivity) between locations on the DUT and the test head contacts. The established electrical connections in turn can be used by the electronics section of the testing equipment to perform the desired testing.

The ability of the electronics section to perform testing efficiently may be held back by the number of contacts that the test head can simultaneously establish with the DUT. Thus, the ability to increase the number of contacts is often desirable from the point of improved testing efficiency. The desire to increase the number of simultaneous contacts generally increases with the complexity of the DUT to be tested. While more contact points are desired, the physical space occupied by the test head and DUT is often fixed by the physical configuration of the overall testing equipment.

In addition to the demand for more contacts, there may be a demand to test a larger DUT. Where the combined space occupied by the test head and DUT is fixed by the physical configuration of the testing equipment, the ability to accommodate a larger DUT may be limited by the space occupied by the test head.

Thus, there is a demand for test head designs which improve the usage of physical space occupied by the test head whereby more contacts can be simultaneously made in the same test head space and/or larger DUT can be accommodated. These demands are especially apparent in the context of existing auto handler and manual DUT board testing equipment as well as in the area of wafer-level testing and burn-in using wafer prober apparatus which typically involves the interfacing of probe cards and wafers (or other device under test) with various contact structures.

SUMMARY OF THE INVENTION

The invention provides improved test head designs which enable the provision of more contact points and/or the accommodation of a larger DUT or probe card. More specifically, the invention enables these benefits by an improved design for establishing contact between the DUT or probe card and electrical contacts contained in the test head. The invention further provides improved designs for engaging clamp or guide rings in test head structures.

In one aspect, the invention encompasses a test head structure, the test head comprising a clamp for holding a DUT or probe card, an electrical contact member containing electrical contacts for contacting the DUT or probe card, and a means for bringing the electrical contacts into a releasably locked position wherein the electrical contacts electrically contact points on a DUT or probe card held by the clamp, the means comprising:

(a) a pull arm, the pull arm being releasably coupled with the clamp, and the pull arm being movable relative to the electrical contact member, (b) a means for moving the pull arm relative to the electrical contact member, (c) a guide means for guiding movement of the pull arm relative to the clamp and the electrical contacting member, the guide means being fixed to the clamp, (d) releasable fixing means for releasably fixing the guide means to the pull arm, the releasable fixing means being reversibly changeable between (i) a fixing position wherein any movement of the pull arm causes a corresponding movement of the clamp and (ii) a releasing position wherein any movement of the pull arm does not cause a corresponding movement of the clamp, and (e) controlling means for changing the position of the releasable fixing means between positions (i) and (ii) in response to the position of the pull arm relative to the position of the electrical contacting means.

The clamp is preferably capable of holding a wafer or printed circuit board. The electrical contacts preferably include "pogo" pins. The guide means are preferably pins which run through the clamp and the pull down arm. The releasable fixing means is preferably one or more spring clips and the controlling means is preferably a spreader pin(s) which can be brought into and out of engagement with the spring clips.

In another aspect, the invention encompasses a test head structure for use with probe card changer equipment, the test head comprising a guide ring for guiding a probe card, an electrical contact member containing electrical contacts for contacting the probe card, and a means for bringing the guide ring into a releasably locked position wherein the electrical contacts electrically contact points on a probe card held within the guide ring, the means comprising:

(a) a pull arm, the pull arm being releasably coupled with the guide ring, and the pull arm being movable relative to the electrical contact member, (b) a means for moving the pull arm relative to the electrical contact member, (c) a guide means for guiding movement of the pull arm relative to the guide ring and the electrical contacting member, the guide means being fixed to the guide ring, (d) releasable fixing means for releasably fixing the guide means to the pull arm, the releasable fixing means being reversibly changeable between (i) a fixing position wherein a movement of the pull arm causes a corresponding movement of the guide ring and (ii) a releasing position wherein a movement of the pull arm does not cause a corresponding movement of the guide, and (e) controlling means for changing the position of the releasable fixing means between positions (i) and (ii) in response to the position of the pull arm relative to the position of the electrical contacting means.

The invention further encompasses testing apparatus and methods using the test heads of the invention. The invention also encompasses other apparatus using the moving, engaging and releasing means of the invention to reversibly bring two members into a fixed position relative to each other. The invention is especially useful in the context of manual test, auto handler and wafer prober testing equipment.

These and other aspects of the invention are described in further detail below.

BRIEF DESCRIPTION OF THE DRAWINGS

FIG. 2 shows a schematic cross section view of a test head structure and a DUT according to the invention with clamp ring in a released position.

FIG. 3 shows a schematic cross section view of a test head structure and a DUT according to the invention with clamp ring detent engagement.

FIG. 4 shows a schematic cross section view of a test head structure and a DUT according to the invention with clamp ring in a seated position.

DETAILED DESCRIPTION OF THE INVENTION

The invention provides improved test head designs which enable the provision of more contact points and/or the accommodation of a larger DUT or probe card. More specifically, the invention enables these benefits by an improved design for establishing contact between the DUT or probe card and electrical contacts contained in the test head. The invention further encompasses testing apparatus and methods using the test head of the invention such as manual board testing equipment, auto handler test equipment, wafer prober test equipment, etc. The invention also encompasses other apparatus using the moving, engaging and releasing means of the invention to reversibly bring two members into a fixed position relative to each other.

Figure 1:
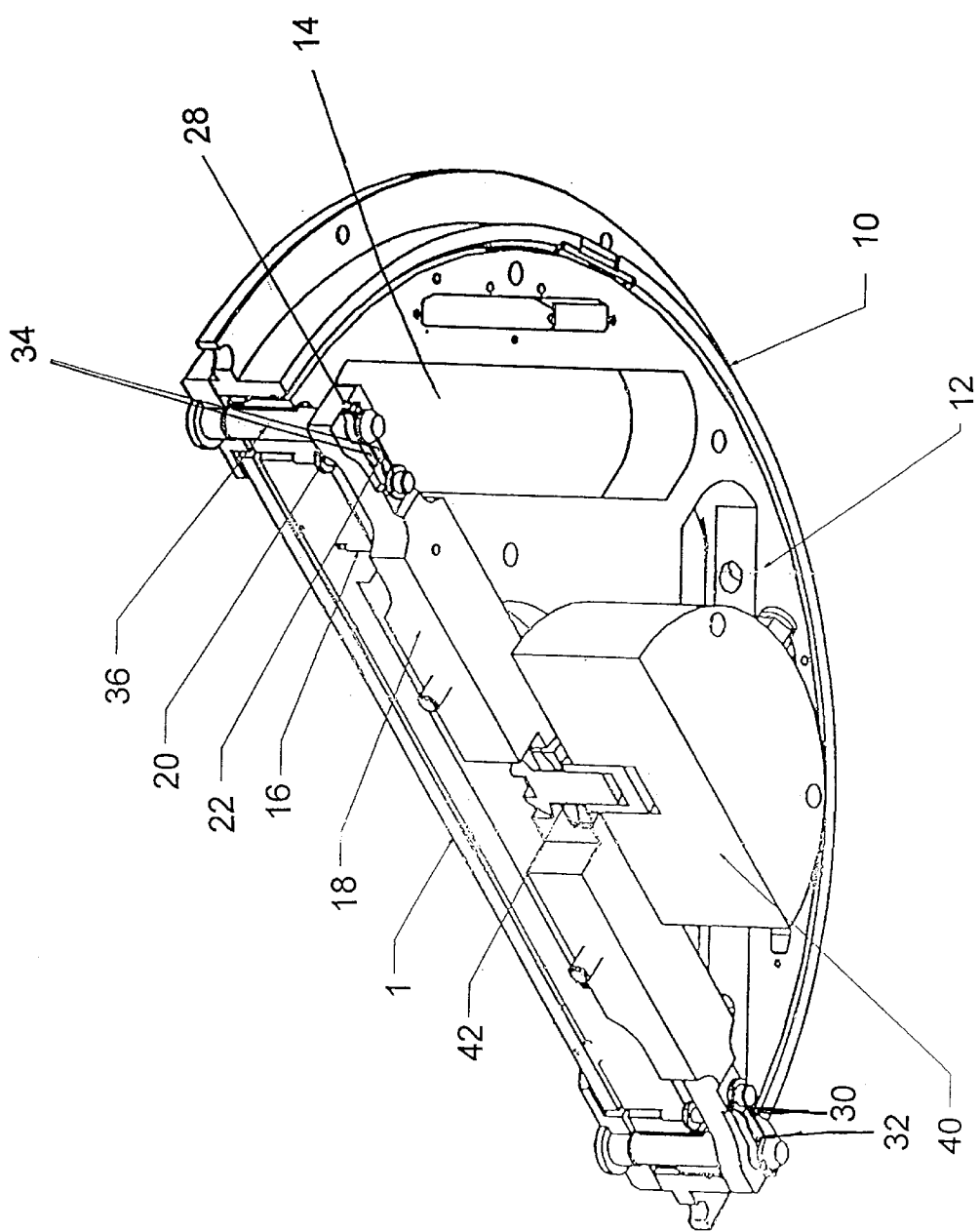
FIG. 1 shows an upside down isometric schematic view of a test head structure of the invention.
Figure 5:
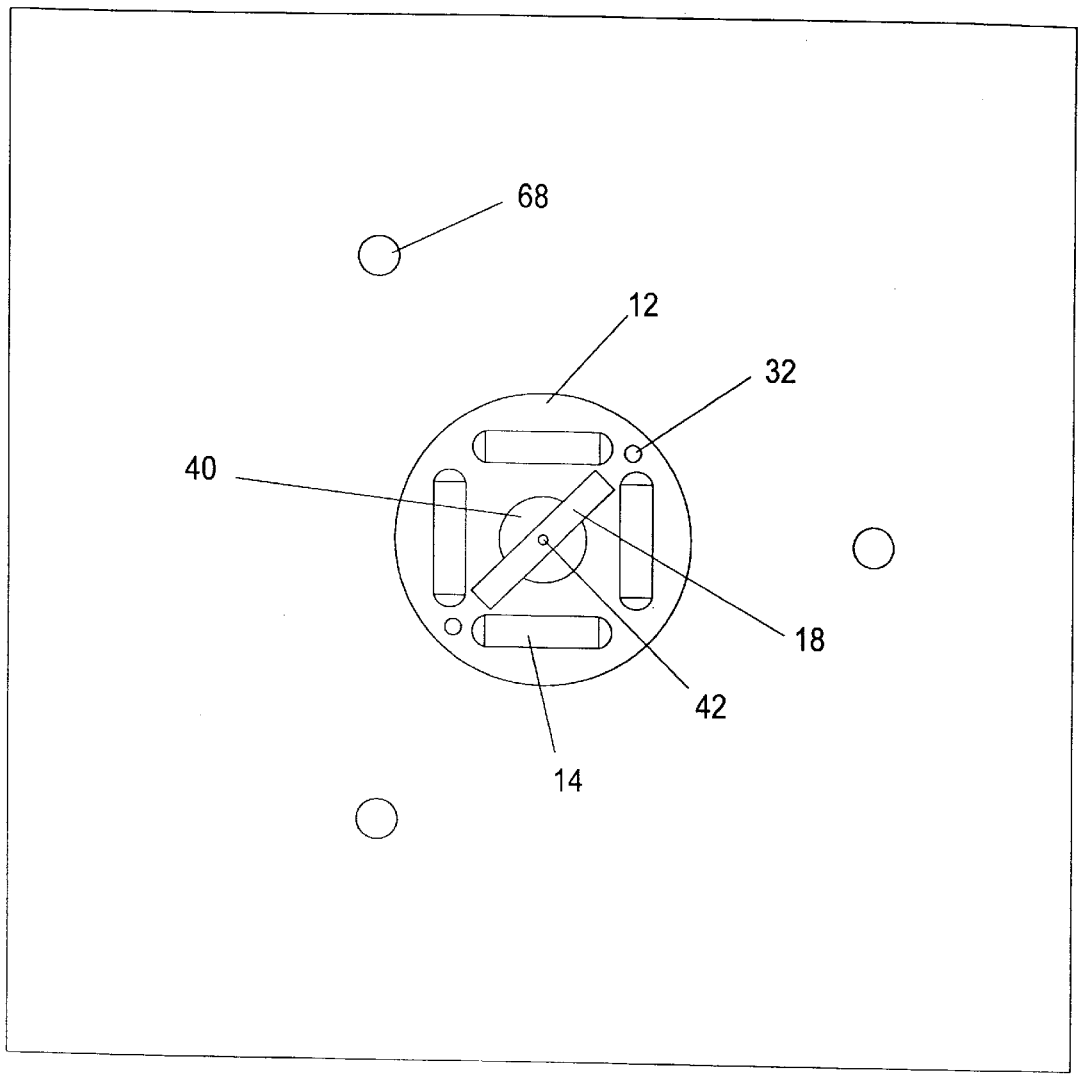
FIG. 5 shows a schematic plan view of a clamp test head structure with the DUT and clamp ring removed.

While the discussion below refers to a DUT, it should be understood that a probe card or other board can be used in the alternative wherever DUT is mentioned in the discussion below. A test head structure according to the invention is illustrated in FIGS. 1–5. In FIG. 1, a DUT 1 is engaged by a clamp ring 10 which acts as a clamp for DUT 1. While clamp ring 10 is shown as a circular shape (see FIG. 5), the actual shape of the clamp ring or other holder used may be varied depending on the geometry of the DUT and the spatial constraints and requirements of the other test head components and the overall testing apparatus. Typically, the clamp ring 10 is circular such as would fit around the periphery of the test head shown in FIG. 5. The clamp ring or holder should be made of a material having suitable strength (stiffness) as may be needed in order to properly contact the DUT with the electrical contacts (not shown) of the test head. Where the clamp ring is made of metal, appropriate electrical insulation is preferably provided as needed to prevent any unwanted electrical interactions with the DUT or components of the testing apparatus. The DUT is typically detachably fixed to the clamp ring 10 by spring clips or other fastening means (not shown) around the periphery of the DUT.

The electrical contacts are preferably housed in a support member 12 which provides one or more spaces 14 for accommodating the desired contacts. The amount of space that can be provided for the electrical contacts is a function of the overall space allowed for the test head in the testing equipment and of the amount of space taken by the other components of the test head. Preferably, one or more alignment pins 16 are located in holes in support member 12. The alignment pins 16 enable alignment of support member 12 with underlying pull arm 18. In addition to alignment pins 16, preferably one or more spreader pins 20 are located in support member 12. Spreader pins 20 are fixed in support member 12, but slidably pass through holes in pull arm 18 whereby spreader pins 20 can be brought into and out of engagement with spring clips 22, fixed to the underside of pull arm 18, by the travel of pull arm 18. In order for this type of action to occur, support member 12 is fixed in the testing apparatus by screws or other fixing means (not shown) in conjunction with members such as 62 and 64 discussed further below.

Other expedients may also be located on support member 12. Preferably, one or more DUT stops 24 are located on the side of member 12 facing the DUT. Additionally, an electrical detection switch 26 may be located on the side of member 12 facing the DUT to detect whether a DUT is present in the test head. Support member 12 is preferably adapted to contain one or more nests of electrical contacts such as pogo pins.

Pull arm 18 contains one or more spring clips 22 which are fixed to its underside at locations 28. Spring clips 22 are preferably aligned over holes 30 and 32 in pull arm 18. Preferably, the spring clips 22 have arms 34 which are configured such that their rest (untensioned) position corresponds to a spacing of arms 34 which is narrower than the diameter of the spreader pin 20 which may pass through hole 30 and gripper pin 36 which may pass through hole 32 respectively where spring clips 22 pass over those holes. The spring clip arms 34 are also preferably configured such that the when the spreader pin 20 spreads the clip arms 34 at hole 30, the arms open at hole 32 to a distance greater than or equal to the diameter of gripper pins 36 passing through hole 32 from clamp ring 10. Clip arms 34 preferably have sufficient strength and stiffness such that they can grip gripper pins 36 to thereby couple the movement of clamp ring 10 and pull arm 18 when the spreader pin 20 is disengaged from spring clip 22. This gripping strength should be at least sufficient enough to pull clamp ring 10 down with the downward movement of pull arm 18 and maintain DUT 1 in adequate contact pressure with the electrical contacts contained in member 12 over the period of the desired testing.

Pull arm 18 is generally located beneath clamp ring 10 and electrical contact support member 12. Pull arm 18 is coupled with a means for moving pull arm 18 relative to member 12. The moving means may be any conventional mechanism for generating the necessary moving force in a controlled manner. Preferably, the moving means is a pneumatic device such as air cylinder 40 shown in the drawings. Moving means 40 is coupled to pull arm 18 using any conventional coupling means such as the combination of ball washers and stud shown generally as 42. While pneumatic devices are preferred means for powering the movement of pull arm 18, it should be understood that other devices such as motors, manually applied leverage, etc. can be used for this purpose.

The test head structure of the invention may be adapted for incorporation into the housing of various testing apparatus. For example, the air cylinder 40 can be attached to a base plate 60 of a testing apparatus. The apparatus may contain further means for securing the test head such as alignment plate 62 with an attached member 64 with a ball detent 66. The clamp ring 10 or other component of the test head structure of the invention may contain features for attachment or alignment such as a groove 44 adapted to engage detent 66 on the pull down of clamp ring 10. Alignment plate 62 is preferably fixed to base plate 60 through rough guide pins 68 which engage air bladders which are fixed to base plate 60. Similarly, support member 12 may be attached to the alignment plate 62 or other portions of the testing apparatus using any conventional fastening means.

Figure 6:
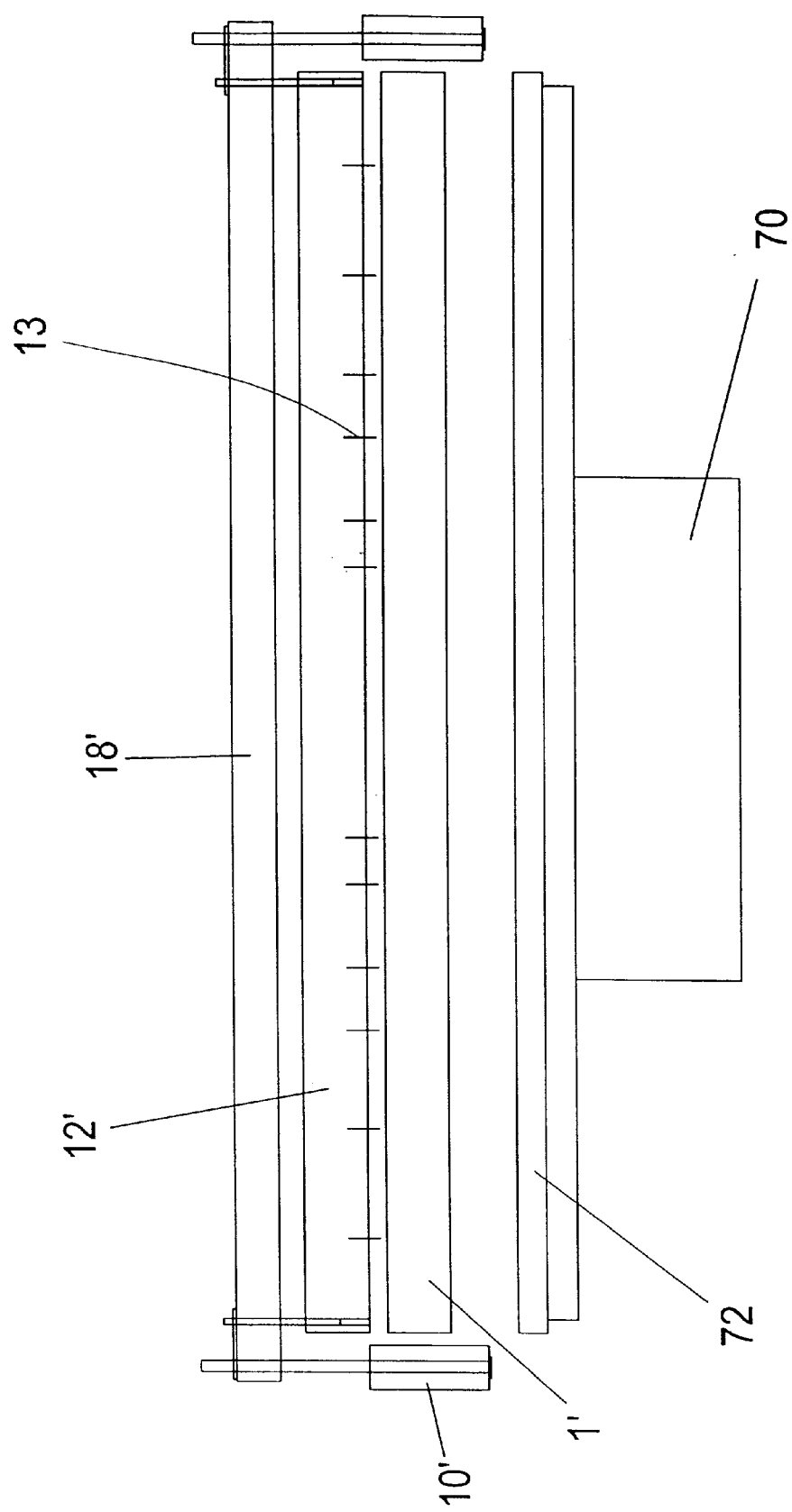
FIG. 6 shows a schematic cross section view of a test head of the invention for use with a probe card changer and wafer prober.

The test head structure of the invention is preferably used in devices such as manual DUT board test equipment, automated test and/or burn-in equipment, auto-handlers, wafer probers, etc. A typical manual test set up would be similar to the set up in FIGS. 1–4 where a connection would be made manually to the upper side of the DUT. The configuration shown in FIGS. 1–5 could be used in an auto handler where the DUT would be automatically manipulated and connected for testing. Where the invention is used for wafer-level testing or burn-in, the DUT typically would be replaced by a probe card.

Where a probe card changer is used in conjunction with the test head, the clamp ring would typically be reconfigured as a guide ring 10' as shown in FIG. 6. In this embodiment, the actuation mechanism of the invention acts primarily to retain and control the position of guide ring 10' relative to the electrical contact support member 12'. As can be seen in FIG. 6, the invention encompasses embodiments where the pull arm 18' is actuated by upward movement. The actuation mechanism of the invention may this be adapted to any desired orientation. In the embodiment of FIG. 6, the probe card 1' is held in place by the member 70 which also engages wafer 72 (or other DUT) by upward movement toward contacts 13 of electrical contact support member 12'. In some instances, guide ring 10' may be provided with grooves or other features adapted to engage an in coming probe card or probe card cassette. For example, such engagement may occur by rotation of the probe card by the card changer as the card is brought into the guide ring.

The features of the invention enable the construction of test heads housing an increased number of electrical contacts in the same space as conventional test head structures capable of holding only fewer contacts. For example, test head structures containing the features of the invention can be used to house a 1024 contact pin tester in the 14 inch (356 mm) test head snout diameter and 32 inch (813 mm) overall test head width which is only capable of holding 500 pins using conventional test head designs. The ability to increase pin count for the same test head space enables the adaptation of existing testing equipment to more complex testing procedures and the testing of more complex devices.

The test head structure of the invention may be constructed from any materials suitable for the intended use of the machine. Thus, parts such as the stiffener/clamp ring, the gripper pins, etc. should be made strong enough to withstand the stresses associated with repeated operation in clamping a DUT, probe card or other board against the electrical contacts as would be routinely done in the testing of integrated circuit wafers, printed circuit boards, etc.

In addition to testing apparatus, the structures of the invention may be used for other applications wherein it is desired to releasably bring a component into pressured contact with an element of the device.

The invention further encompasses methods using the test head structure of the invention. In a method of the invention, the support member containing the electrical contacts (e.g. a nest of pogo pins) is fixed in place over the pull arm such that the spreader pins in the support member engage the spring clips of the pull arm with the pull arm in its up position. The clamp ring and DUT or probe card are then placed over the support member with the gripper pins of the clamp ring passing through the appropriate holes in the pull arm and spring clips. The air cylinder may then be engaged to move the pull arm downward. The movement of the pull arm causes the decoupling of the spreader pins from the spring clips allowing the spring clips to close around the gripper pins. The closing of the spring clips couples the pull arm with the clamp ring through the gripper pins such that continued downward movement of the pull arm results in downward movement of the clamp ring. The downward moving clamp ring then causes the DUT or probe card to be forced against the contact pins housed in the support member, thereby allowing the desired electrical testing (or other operation) to take place.

Release of the DUT or probe card is accomplished by simply reversing the movement of the pull arm to cause an initial upward movement of the clamp ring. The movement of the clamp ring stops when the upward movement of the pull arm causes the spreader pins to engage the spring clips thereby causing the spring clips to release hold of the gripper pins. The DUT or probe card can then be removed as desired. While the method of the invention can be performed manually, it is contemplated that the automation would be used to enable the automatic testing/processing of DUT or manipulation of probe cards using the method of the invention.

As noted above, the invention is not limited to methods using any specific orientation of the test head. Thus, the test head can be used in any suitable orientation according to the specific test equipment set up. Where a probe card changer is used, a guide ring is used instead of a clamp ring and the movement of the pull arm caused the guide ring to become fixed relative to the electrical contact support member.

What is claimed is:

1. A test head apparatus comprising a clamp for a board, an electrical contact member containing electrical contacts for contacting the board, and a means for bringing the electrical contacts into a releasably locked position wherein the electrical contacts electrically contact points on a board held by the clamp, the means comprising:

(a) a pull arm, the pull arm being releasably coupled with the clamp, and the pull arm being movable relative to the electrical contact member, (b) a means for moving the pull arm relative to the electrical contact member, (c) a guide means for guiding movement of the pull arm relative to the clamp and the electrical contacting member, the guide means being fixed to the clamp, (d) releasable fixing means for releasably fixing the guide means to the pull arm, the releasable fixing means being reversibly changeable between (i) a fixing position wherein any movement of the pull arm causes a corresponding movement of the clamp and (ii) a releasing position wherein any movement of the pull arm does not cause a corresponding movement of the clamp, and (e) controlling means for changing the position of the releasable fixing means between positions (i) and (ii) in response to the position of the pull arm relative to the position of the electrical contacting member.

2. The test head apparatus of claim 1 wherein the clamp is capable of holding a board selected from probe cards, semiconductor wafers, or printed circuit boards.

3. The test head apparatus of claim 1 wherein the electrical contacts comprise pogo pins.

4. The test head apparatus of claim 1 wherein the guide means comprises pins which run through the clamp and the pull arm.

5. The test head apparatus of claim 1 wherein the releasable fixing means comprises one or more spring clips attached to said pull arm.

6. The test head apparatus of claim 5 wherein the controlling means comprises at least one spreader pin which can be brought into and out of engagement with said spring clip.

7. The test head apparatus of claim 6 wherein said spreader pin is aligned with a hole in said pull arm whereby said spreader pin passes through said hole to engage said spring clip.

8. The test head apparatus of claim 7 wherein said apparatus comprises two spreader pins and two spring clips.

9. A method of releasably contacting a board against electrical contacts housed in a support member, said method comprising:

(a) placing said support member over a pull arm whereby spreader pins fixed in said support member engage spring clips fixed to said pull arm, (b) placing a clamp and said board to be contacted over said support member whereby said board lies between said clamp and said support member and gripper pins project from said clamp through holes in said pull arm, (c) pulling said pull arm relative to a position of said support member whereby said spreader pins disengage from said spring clips, said spring clips thereby contracting to grip said gripper pins, and (d) continuing pulling said pull arm whereby said clamp is moved closer to said support member to cause pressured contact between said board and said contacts housed in said support member.

10. The method of claim 9 further comprising:

(e) moving said pull arm relative to said support member whereby said clamp is moved away from said support member to release said board from pressured contact.

11. The method of claim 9 wherein said board is selected from probe cards, semiconductor wafers, or printed circuit boards.

12. The method of claim 9 further comprising electrically testing said board through said electrical contacts.

13. The method of claim 9 wherein said pulling down is performed using a pneumatically powered member attached to said pull arm.

14. The method of claim 13 wherein said pneumatically powered member comprises an air cylinder.

15. The method of claim 9 wherein said support member houses at least 500 electrical contacts which are contacted with said board in step (d).

16. The method of claim 9 wherein said support member houses at least 1024 electrical contacts which are contacted with said board in step (d).

17. A test head apparatus comprising a guide ring for a probe card, an electrical contact support member containing electrical contacts for contacting the probe card, and a means for bringing the electrical contacts into a position wherein the electrical contacts electrically contact points on said probe card in said guide ring, the means comprising:

(a) a pull arm, the pull arm being releasably coupled with the guide ring, and the pull arm being movable relative to the electrical contact support member, (b) a means for moving the pull arm relative to the electrical contact support member, (c) a guide means for guiding movement of the pull arm relative to the guide ring and the electrical contact support member, the guide means being fixed to the guide ring, (d) releasable fixing means for releasably fixing the guide means to the pull arm, the releasable fixing means being reversibly changeable between (i) a fixing position wherein any movement of the pull arm causes a corresponding movement of the guide ring and (ii) a releasing position wherein any movement of the pull arm does not cause a corresponding movement of the guide ring, and (e) controlling means for changing the position of the releasable fixing means between positions (i) and (ii) in response to the position of the pull arm relative to the position of the electrical contact support member.

18. The testing apparatus of claim 17 wherein said guide ring contains means for engaging a probe card or probe card cassette.

* * * * *